United States Patent
Hong et al.

(10) Patent No.: US 9,818,767 B2
(45) Date of Patent: Nov. 14, 2017

(54) DISPLAY DEVICE HAVING JUMPING STRUCTURE WITH CONNECTION ELECTRODE AND METHOD FOR FABRICATING THE SAME

(71) Applicant: LG DISPLAY CO., LTD., Seoul (KR)

(72) Inventors: Hyun Seok Hong, Goyang-si (KR); Jung Eun Ahn, Gumi-si (KR); In Kang, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/500,412

(22) Filed: Sep. 29, 2014

(65) Prior Publication Data

US 2015/0091101 A1    Apr. 2, 2015

(30) Foreign Application Priority Data

Sep. 30, 2013  (KR) ........................ 10-2013-0115872

(51) Int. Cl.
| | | |
|---|---|---|
| H01L 29/08 | (2006.01) | |
| H01L 35/24 | (2006.01) | |
| H01L 51/00 | (2006.01) | |
| H01L 27/12 | (2006.01) | |
| G02F 1/1362 | (2006.01) | |

(52) U.S. Cl.
CPC ...... H01L 27/124 (2013.01); G02F 1/136227 (2013.01); G02F 1/136286 (2013.01); H01L 27/1248 (2013.01); H01L 27/1255 (2013.01); H01L 27/1259 (2013.01)

(58) Field of Classification Search
CPC ............... H01L 27/124; H01L 27/1255; H01L 27/1259; H01L 27/00; H01L 51/50; H01L 2227/32; H01L 32/42; H01L 27/1214; H01L 27/153; G02F 1/1368; G02F 1/136227; G02F 1/136286
USPC .... 257/E27.111, 59, E29.273, 401, E51.022, 257/E23.023, 40, 744, 43, 72, 66, 761, 257/763; 438/104, 149, 34, 158, 438/FOR. 157, FOR. 287; 349/43, 147
See application file for complete search history.

(56) References Cited

U.S. PATENT DOCUMENTS

2007/0023760 A1\* 2/2007 Kim et al. ........................ 257/72
2009/0091675 A1\* 4/2009 Park .................. G02F 1/134309
                                                                349/43

(Continued)

FOREIGN PATENT DOCUMENTS

KR        20110113398 A  * 10/2011  ................ 438/149
KR      1020110113398 A    10/2011

*Primary Examiner* — Thao X Le
*Assistant Examiner* — Nduka Ojeh
(74) *Attorney, Agent, or Firm* — Dentons US LLP

(57) ABSTRACT

Disclosed is a display device that may include a pixel electrode formed on source and drain electrodes, the pixel electrode electrically connected with the drain electrode, and a first protection electrode formed on a second metal pattern, the first protection electrode electrically connected with the second metal pattern and at least partially covering the second metal pattern; and a connection electrode formed on a passivation film, the connection electrode connected with a first metal pattern through a first contact hole, and connected with the first protection electrode through a second contact hole, wherein the first protection electrode is formed of the same material as that of the pixel electrode.

22 Claims, 12 Drawing Sheets

(56) References Cited

U.S. PATENT DOCUMENTS

| | | | |
|---|---|---|---|
| 2010/0149473 A1* | 6/2010 | Guo | G02F 1/1345 349/122 |
| 2011/0037068 A1* | 2/2011 | Yamazaki et al. | 257/43 |
| 2011/0128492 A1* | 6/2011 | Kim | G02F 1/133514 349/144 |
| 2011/0177639 A1* | 7/2011 | Kang | H01L 21/76816 438/34 |
| 2011/0221992 A1 | 9/2011 | Iwanami | |
| 2011/0234936 A1* | 9/2011 | Yang | G02F 1/134363 349/46 |
| 2011/0242444 A1* | 10/2011 | Song | G06F 3/0412 349/43 |
| 2012/0113376 A1 | 5/2012 | Hayashi et al. | |
| 2013/0112979 A1 | 5/2013 | Nam et al. | |
| 2013/0127752 A1* | 5/2013 | Takeuchi et al. | 345/173 |
| 2013/0147724 A1 | 6/2013 | Hwang et al. | |
| 2013/0162570 A1 | 6/2013 | Shin et al. | |
| 2013/0194224 A1* | 8/2013 | Lai | 345/174 |
| 2013/0234331 A1* | 9/2013 | Okumoto | 257/744 |
| 2014/0240630 A1 | 8/2014 | Jung | |

\* cited by examiner

DISPLAY DEVICE HAVING JUMPING STRUCTURE WITH CONNECTION ELECTRODE AND METHOD FOR FABRICATING THE SAME

CROSS REFERENCE TO RELATED APPLICATIONS

This application claims the benefit of the Korean Patent Application No. 10-2013-0115872 filed on Sep. 30, 2013, which is hereby incorporated by reference for all purposes as if fully set forth herein.

BACKGROUND OF THE INVENTION

Field of the Invention

The present invention relates to a display device, and more particularly, to a jumping structure of a display device and method for fabricating the same.

Discussion of the Related Art

Various display devices such as liquid crystal display devices, plasma display panels and organic light emitting display devices have been developed.

In these display devices, a jumping structure is typically used to electrically connect signal lines with each other that are formed on different layers, whereby the same data can be applied to the signal lines.

Hereinafter, a general jumping structure will be described with reference to FIG. 1. FIG. 1 is a cross-sectional view illustrating a jumping structure according to the related art, especially illustrating a jumping structure formed in a pad region of a display device.

As shown in FIG. 1, in the display device having a jumping structure according to the related art, a first line 12 is patterned on a substrate 10, and an insulating film 14 is formed on an entire surface of the substrate 10 including the first line 12. At this time, the insulating film 14 is provided with a first contact hole CH1 for partially exposing the first line 12. A second line 16 is patterned on the insulating film 14, and a passivation film 18 is formed on an entire surface of the insulating film 14 including the second line 16. At this time, the passivation film 18 is provided with a second contact hole CH2 for partially exposing the second line 16. A connection electrode 20, which is formed on the passivation film 18, is electrically connected with the first line 12 through the first contact hole CH1 and the second line 16 through the second contact hole CH2. The first line 12 and the second line 16, which are formed on their respective layers that are different from each other, are electrically connected with each other through the connection electrode 20.

However, when forming the jumping structure as shown in FIG. 1, the second line 16 is also subject to an etching condition during the process of forming the first and second contact holes CH1, CH2 in the passivation film 18 to expose the second line 16, whereby the morphology of the second line 16 is worsened. In addition, the morphology of the second line 16 may already have been deteriorated during the previous etching process for forming a drain contact hole (not shown). That is, the morphology of the second line 16 may be affected by two etching processes, namely the etching process for forming the drain contact hole and the etching process for forming the second contact hole CH2. This may lead to a problem in that an undercut, which is illustrated in FIG. 2, occurs due to the deterioration of morphology of the second line 16. Also, as shown in FIG. 3, such an undercut may create a region on the second line 16 where the connection electrode 20 is opened.

SUMMARY OF THE INVENTION

Accordingly, the present invention is directed to a display device and method for fabricating the same that substantially obviates one or more problems due to limitations and disadvantages of the related art.

An advantage of the present invention is to provide a display device and method for fabricating the same that can reduce or preventing an undercut in its jumping structure that is used for electrically connecting signal lines that are formed on different layers.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display device may include a gate electrode and a first metal pattern on a substrate, the gate electrode being formed on a first region of the substrate and the first metal pattern being formed on a second region of the substrate; an insulating film formed on the gate electrode and the first metal pattern and provided with a first hole for exposing at least a part of the first metal pattern; source and drain electrodes formed on the insulating film in the first region and a second metal pattern formed on the insulating film in the second region; a pixel electrode formed on the source and drain electrodes, the pixel electrode electrically connected with the drain electrode, and a first protection electrode formed on the second metal pattern, the first protection electrode electrically connected with the second metal pattern and at least partially covering the second metal pattern; a passivation film formed on an entire surface of the substrate including the pixel electrode and the first protection electrode and provided with a second hole for exposing at least a part of the first metal pattern and a third hole for exposing at least a part of the first protection electrode; and a connection electrode formed on the passivation film, the connection electrode connected with the first metal pattern through a first contact hole formed by a combination of the first hole and the second hole, and connected with the first protection electrode through a second contact hole formed of the third hole, wherein the first protection electrode is formed of the same material as that of the pixel electrode.

In one or more embodiments, the first protection electrode is extended to a region where the second metal is not formed on the insulating film, and the third hole is formed in the passivation film to expose the extended region of the first protection electrode, which is not overlapped with the second metal.

In one or more embodiments, the display device further comprises: a planarization film formed on the source and drain electrodes in the first region and formed on the second metal in the second region to partially expose the second metal, wherein the pixel electrode is formed on the planarization film in the first region, to be electrically connected with the drain electrode, wherein the first protection electrode is formed on the planarization film and the second metal which is not provided with the planarization film in the second region to at least partially cover the second metal, and wherein the first metal is formed of the same material as that of the gate electrode and the second metal is formed of the same material as that of the source and drain electrodes.

In one or more embodiments, the planarization film is formed of acrylic resin including photo active compound (PAC).

In one or more embodiments, the first metal is configured as a gate pad and the second metal is configured as a data pad.

In one or more embodiments, the display device further comprises a second protection electrode formed between the first protection electrode and the passivation film, wherein the connection electrode is connected with the first protection electrode through the second protection electrode.

In one or more embodiments, the display device further comprises a common electrode for receiving a touch signal of a user and a sensing line connected with the common electrode, wherein the second protection electrode is formed using the same material as that of the sensing line, and the connection electrode is formed of the same material as that of the common electrode.

In one or more embodiments, the display device further comprises a common electrode for receiving a touch signal of a user and a sensing line connected with the common electrode, wherein the connection electrode is formed using the same material as that of the common electrode.

In another aspect of the present invention, a method for fabricating a display device may include forming a gate insulating film, which has a hole for exposing at least a part of a first metal pattern, on a gate electrode formed on a first region of a substrate and the first metal pattern formed on a second region of the substrate; forming source and drain electrodes on the gate insulating film of the first region, and forming a second metal pattern on the insulating film of the second region; forming a first material layer for forming a pixel electrode, on an entire surface of the substrate including the source electrode, the drain electrode, and the second metal pattern; forming the pixel electrode electrically connected with the drain electrode on the first region by patterning the first material layer and forming a first protection electrode, which is electrically connected with the second metal pattern and covers the second metal pattern, on the second metal pattern in the second region; forming a passivation film on an entire surface of the substrate including the pixel electrode and the first protection electrode, the passivation film being provided with a second hole for exposing at least a part of the first metal pattern and a third hole for exposing at least a part of the first protection electrode; and forming a common electrode on the passivation film in the first region and forming a connection electrode on the passivation film in the second region, the connection electrode being connected with the first metal pattern through a first contact hole formed by a combination of the first hole and the second hole and being connected with the first protection electrode through a second contact hole formed of the third hole.

In one or more embodiments, the first protection electrode is extended to a region where the second metal is not formed on the insulating film, and the third hole is formed in the passivation film to expose the extended region of the first protection electrode, which is not overlapped with the second metal.

In one or more embodiments, between the step of forming the second metal and the step of forming the first material layer, the method further comprises the step of forming a planarization film on the entire surface of the substrate including the source and drain electrodes in the first region and on the second metal to partially expose the second metal in the second region, wherein the first protection electrode is formed on the planarization film and the second metal where the planarization film is not formed to cover the second metal in the second region.

In one or more embodiments, the planarization film is formed of acrylic resin including photo active compound (PAC).

In one or more embodiments, the method further comprises the steps of forming a second material layer on the entire surface of the substrate including the first protection electrode and the pixel electrode and forming a sensing line connected with the common electrode to receive a touch signal of a user on the pixel electrode in the first region and forming a second protection electrode on the first protection electrode in the second region by patterning the second material layer between the step of forming the pixel electrode and the step of forming the passivation film, wherein the connection electrode is connected with the first protection electrode through the second protection electrode.

In one or more embodiments, the connection electrode and the common electrode are formed using the same material as each other at the same time.

To achieve the above-mentioned objects and other advantages and in accordance with the purpose of the invention, as embodied and broadly described herein, a display device according to one aspect of the present invention, as illustrated in FIG. 4 or 5, comprises a gate electrode and a gate pad formed on a substrate, the gate electrode being formed on a first region of the substrate and the gate pad being formed on a second region of the substrate; an insulating film formed on the gate electrode and the gate pad and provided with a first hole for exposing at least a part of the gate pad; source and drain electrodes formed on the insulating film in the first region and a data pad formed on the insulating film in the second region; a pixel electrode formed on the source and drain electrodes, to be electrically connected with the drain electrode, and a first protection electrode formed on the data pad, to be electrically connected with the data pad and cover the data pad; a passivation film formed on an entire surface of the substrate including the pixel electrode and the first protection electrode and provided with a second hole for exposing at least a part of the gate pad and a third hole for exposing at least a part of the first protection electrode; and a connection electrode formed on the passivation film, connected with the gate pad through a first contact hole made by combination of the first hole and the second hole, and connected with the first protection electrode through a second contact hole made of the third hole, wherein the first protection electrode is formed of the same material as that of the pixel electrode.

In another aspect of the present invention, as illustrated in FIG. 8 or 9, a display device comprises a gate electrode and a first metal formed on a substrate, the gate electrode being formed on a first region of the substrate and the first metal being formed on a second region of the substrate; an insulating film formed on the gate electrode and the first metal and provided with a first hole exposing at least a part of the first metal; source and drain electrodes formed the insulating film in the first region and a second metal formed on the insulating film in the second region; a planarization film formed on the source and drain electrodes in the first region and formed on the second metal in the second region to partially expose the second metal; a pixel electrode formed on the planarization film in the first region, to be electrically connected with the drain electrode, and a first protection electrode formed on the planarization film and the second metal which is not provided with the planarization film in the second region to cover the second metal; a passivation film formed on an entire surface of the substrate including the pixel electrode and the first protection electrode and provided with a second hole for exposing at least a part of the first metal and a third hole for exposing at least a part of the first protection electrode formed on the planarization film; and a connection electrode formed on the passivation film, connected with the first metal through a first contact hole made by combination of the first hole and the second hole, and connected with the first protection electrode through a second contact hole made of the third hole, wherein the first metal is formed of the same material as that of the gate electrode, the second metal is formed of the same material as that of the source and drain electrodes, and the first protection electrode is formed of the same material as that of the pixel electrode.

In other aspect of the present invention, a method for fabricating a display device comprises forming a gate insulating film, which has a hole for exposing at least a part of a first metal, on a gate electrode formed on a first region of a substrate and the first metal formed on a second region of the substrate; forming source and drain electrodes on the gate insulating film of the first region, and forming a second metal on the insulating film of the second region; forming a first material layer for forming a pixel electrode, on an entire surface of the substrate including the source electrode, the drain electrode and the second metal; forming the pixel electrode electrically connected with the drain electrode on the first region by patterning the first material layer and forming a first protection electrode, which is electrically connected with the second metal and covers the second metal, on the second metal in the second region; forming a passivation film on the entire surface of the substrate including the pixel electrode and the first protection electrode, the passivation film being provided with a second hole for exposing at least a part of the first metal and a third hole for exposing at least a part of the first protection electrode; and forming a common electrode on the passivation film in the first region and forming a connection electrode on the passivation film in the second region, the connection electrode being connected with the first metal through a first contact hole made by combination of the first hole and the second hole and being connected with the first protection electrode through a second contact hole made of the third hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Meanwhile, terminologies disclosed in this specification should be understood as follows.

When some structure is formed "on" or "below" another structure, it is to be understood that the disclosure includes both the case that these structures are in contact with each other and the case that a third structure is interposed between the above structures. However, when the terminology "directly on" or "directly below" is used, it is to be understood that these structures are in contact with each other.

It is to be understood that the singular expression used in this specification may also refer to the plural expression unless defined differently in the context. The terminologies such as "first" and "second" are intended to identify one element from another element, and it is to be understood that the scope of the present invention should not be limited by these terminologies.

Also, it is to be understood that the terminologies such as "include" and "has" are intended so as not to exclude the presence or optional possibility of one or more features, numbers, steps, operations, elements, parts, their combination, or the like.

Hereinafter, the embodiments of the present invention will be described in detail with reference to the accompanying drawings.

Display Device

First Embodiment

Figure 1:
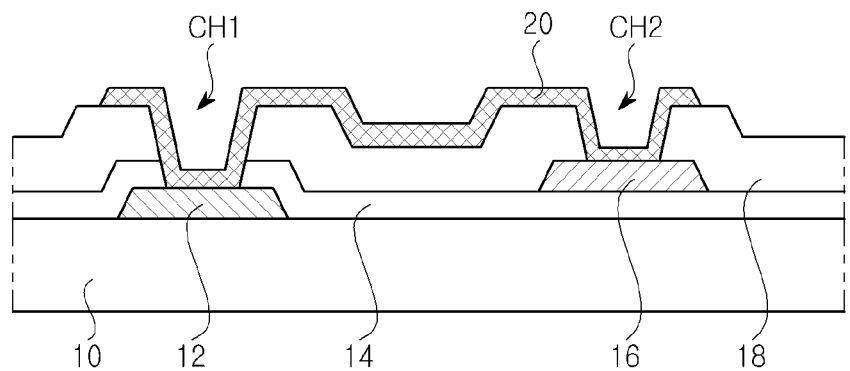
FIG. 1 is a cross-sectional view illustrating a jumping structure formed in a pad region of a display device according to the related art.
Figure 2:
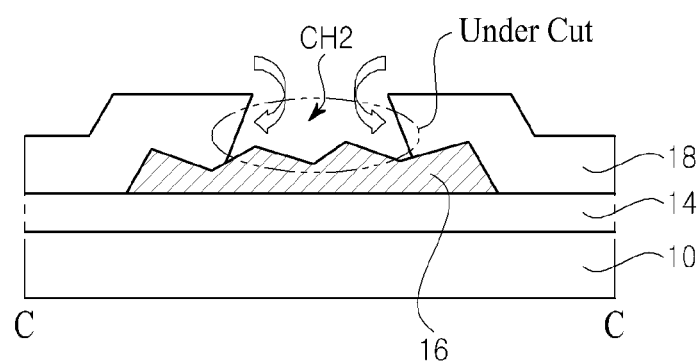
FIG. 2 is a cross-sectional view illustrating an undercut when the jumping structure shown in FIG. 1 is formed.
Figure 3:
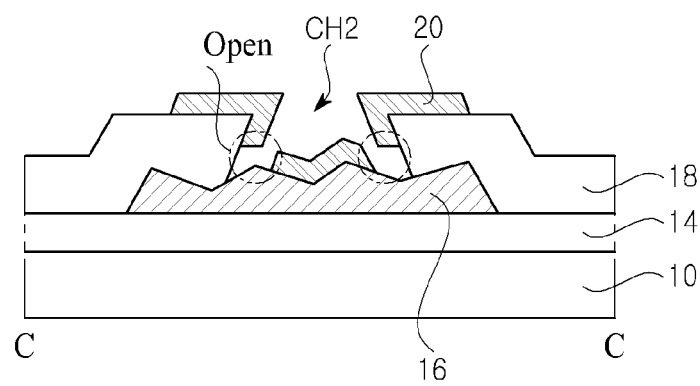
FIG. 3 is a cross-sectional view illustrating an opening of a connection electrode, which may occur when the jumping structure shown in FIG. 1 is formed.
Figure 4:
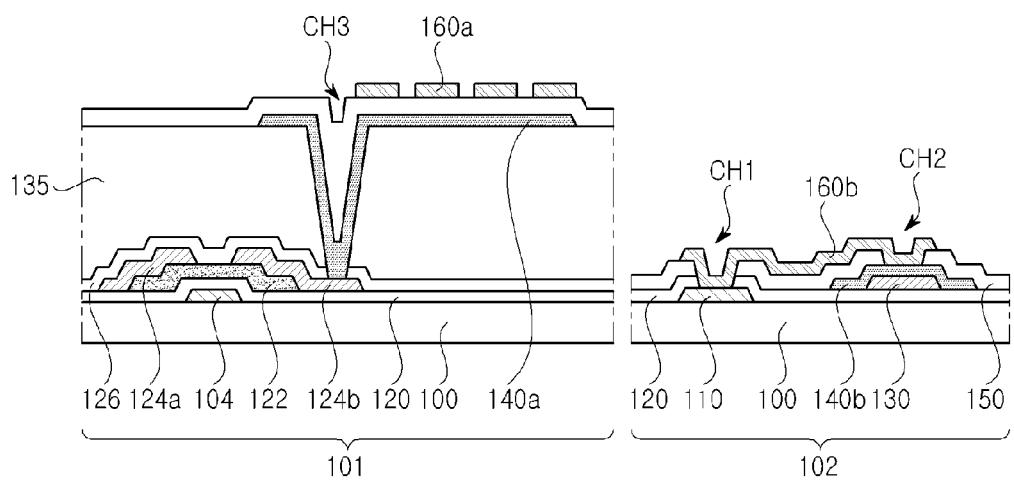
FIG. 4 is a cross-sectional view illustrating a display device to which a jumping structure according to the first embodiment of the present invention is applied.

FIG. 4 is a cross-sectional view illustrating a display device that includes a jumping structure according to the first embodiment of the present invention.

As illustrated in FIG. 4, the display device that includes a jumping structure according to the first embodiment comprises a thin film transistor region 101 where a thin film transistor is formed, and a jumping region 102 where a jumping structure is formed.

First of all, a gate electrode 104 and a first metal 110 are deposited and patterned on a substrate 100. In one embodiment, the first metal 110 may be a gate pad formed of the same material as that of the gate electrode. Hereinafter, for convenience of description, it is assumed that the first metal 110 is a gate pad.

The gate electrode 104 is formed in the thin film transistor region 101, and the gate pad 110 is formed in the jumping region 102. The gate electrode 104 may be extended from a gate line (not shown), and the gate pad 110 may be connected with one end of the gate line through a Gate In Panel (GIP, not shown). The gate in panel refers to a gate driving circuit that is integrated in the panel.

A gate insulating film 120 is formed on the gate electrode 104 and the gate pad 110. The gate insulating film 120 is formed on an entire surface of the substrate 100, and is etched to partially expose the gate pad 110 through a first contact hole CH1. This gate insulating film 120 may be formed by a plasma enhanced chemical vapor deposition (PECVD) method.

A semiconductor layer 122 and a second metal 130 are deposited and patterned on the gate insulating film 120. In one embodiment, the second metal 130 may be a data pad formed of the same material as that of a source electrode 124a and a drain electrode 124b, which will be described later. Hereinafter, for convenience of description, it is assumed that the second metal 130 is a data pad.

The semiconductor layer 122 is formed in the thin film transistor region 101, and may be formed of a silicon based semiconductor material or an oxide semiconductor material. The data pad 130 is formed in the jumping region 102, and is connected with one end of the data line (not shown).

The source electrode 124a and the drain electrode 124b are patterned on the semiconductor layer 122. The source electrode 124a and the drain electrode 124b are formed in the thin film transistor region 101. The source electrode 124a is connected with the data line, and the drain electrode 124b is spaced apart from the source electrode 124a while facing the source electrode 124a.

A first passivation film 126 is formed on the data line, the source electrode 124a, and the drain electrode 124b. The first passivation film 126 is formed in the thin film transistor region 101, and is etched to form a third contact hole CH3. The first passivation film 126 is also etched in the jumping region 102 where the gate pad 110 and the data pad 130 are formed. The first passivation film 126 may be formed of an inorganic insulating material such as silicon nitride or silicon oxide.

A planarization film 135 is formed on the first passivation film 126. The planarization film 135 is formed in the thin film transistor region but may not be formed on the gate pad 110 and the data pad 130. The planarization film 135 may be formed of an organic insulating material such as acrylic resin including a photo active compound (PAC). The planarization film 135 is formed at a thickness greater than that of the first passivation film 126 and may serve to planarize the surface of the substrate.

A pixel electrode 140a is deposited and patterned on the planarization film 135, and a first protection electrode 140b is patterned on the data pad 130. In other words, the first protection electrode 140b is formed on the data pad 130 together with the pixel electrode 140a when the pixel electrode 140a is formed, and is formed of the same material as that of the pixel electrode 140a. The pixel electrode 140a is connected with the drain electrode 124b through the third contact hole CH3. The third contact hole CH3 is made by combination of holes respectively formed in the first passivation film 126 and the planarization film 135.

The first protection electrode 140b is formed on the data pad 130 together with the pixel electrode 140a when the pixel electrode 140a is formed, thereby reducing or preventing the data pad 130 from being etched. In one embodiment, the pixel electrode 140a and the first protection electrode 140b may be formed of a transparent conductive material such as Indium-Tin-Oxide (ITO).

A second passivation film 150 is formed on the pixel electrode 140a and the first protection electrode 140b. The second passivation film 150 is formed on an entire surface of the substrate, and is etched to expose or be part of the first and second contact holes CH1 and CH2. The second passivation film 150 may be formed of an inorganic insulating material such as silicon nitride or silicon oxide. Accordingly, the first protection electrode 140b is partially exposed through the second contact hole CH2.

Because the first protection electrode 140b is formed on the data pad 130, the data pad 130 is not as much exposed to an etching condition as compared with the related art during the process of etching the second passivation film 150 to form the second contact hole CH2, whereby the morphology deterioration caused by etching of the data pad 130 may be reduced or prevented. As a result, an opening or undercut of a connection electrode 160b, which will be described later, may be reduced or prevented.

In the fabrication process according to the related art, two etching processes may negatively affect (e.g., damage) the morphology of the data pad 130, namely an etching process for forming the third contact hole CH3 (at this time, the first passivation film 126 may also be removed from above the data pad 130 thereby exposing the data pad 130 and affecting the surface morphology of the data pad 130) and an etching process for forming the second contact hole CH2 (at this time, the second passivation film 150 may also be removed from above the data pad 130 thereby again exposing the data pad 130 and affecting the surface morphology of the data pad 130).

In the jumping structure according to the first embodiment, the data pad 130 is protected by the first protection electrode 140b during the process of etching the second passivation film 150. Thus, the process of etching the second passivation film 150 may not negatively affect the surface morphology of the data pad 130. Thus, deterioration of the surface morphology of the data pad 130 may be prevented or at least substantially reduced.

A common electrode 160a and the connection electrode 160b are deposited and patterned on the second passivation film 150. The common electrode 160a is formed in the thin film transistor region 101, and the connection electrode 160b is formed in the jumping region 102.

In more detail, the connection electrode 160b is connected with the gate pad 110 through the first contact hole CH1, and is connected with the first protection electrode 140b through the second contact hole CH2. Because the connection electrode 160b is connected with the first protection electrode 140b through the second contact hole CH2 and the first protection electrode 140b is directly connected with the data pad as described above, the connection electrode 160b is also connected with the data pad 130. Accordingly, the gate pad 110 is electrically connected with the data pad 130 through the connection electrode 160b.

The common electrode 160a and the connection electrode 160b may be formed of the same material by the same process.

In the first embodiment, the first protection electrode 140b is formed on the data pad 130 to reduce or prevent the data pad 130 from being etched.

When a display device according to the present invention includes a sensing line for sensing a touch of a user, which is built in a display panel, a second protection electrode may additionally be formed of the same material as that of the sensing line on the first protection electrode 140b to reduce or prevent the data pad 130 from being etched. Hereinafter, a modified embodiment of the first embodiment will be described with reference to FIG. 5.

Figure 5:
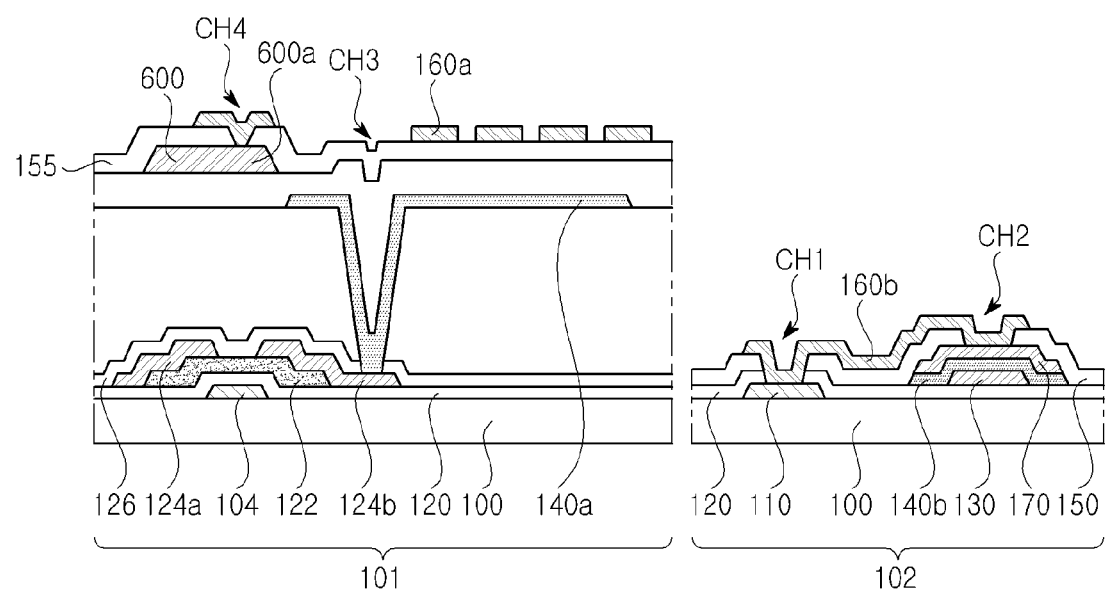
FIG. 5 is a cross-sectional view illustrating a display device to which a jumping structure according to the modified first embodiment of the present invention is applied.

FIG. 5 is a cross-sectional view illustrating a display device to which a jumping structure according to the modified embodiment of the first embodiment of the present invention is applied. For convenience of description, the structures in FIG. 5 that are different from the first embodiment will be described.

A sensing line 600 having a contact portion 600a is deposited and patterned on the second passivation film 150. The sensing line 600 is formed in the thin film transistor region 101. Also, a second protection electrode 170 is formed on the first protection electrode 140b in the jumping region 102 with the same material as that of the sensing line 600.

Because the sensing line 600 is connected with the common electrode 160a, the sensing line 600 serves to transfer a touch signal of a user, which is sensed by the common electrode 160a, to a touch driver (not shown). For transfer of the touch signal of the user, a plurality of sensing lines 600 are connected with a plurality of common electrodes 160a in pairs. In other words, the plurality of sensing lines 600 are respectively connected with the plurality of common electrodes 160a on a one-to-one basis. In order to not reduce light transmittance, the sensing line 600 may be formed to overlap the data line.

According to this embodiment, because the second protection electrode 170 is formed on the first protection electrode 140b in the jumping region 102, the second protection electrode 170 is exposed through the second contact hole CH2, and the connection electrode 160b is connected with the second protection electrode 170 through the second contact hole CH2. Accordingly, the connection electrode 160b is connected with the data pad 130 through the protection electrode 140b and the second protection electrode 170, whereby the gate pad 110 is electrically connected with the data pad 130 through the connection electrode 160b.

A third passivation film 155 is formed on the sensing line 600. A third passivation film 155 is formed on an entire surface of the substrate, and is etched to form a fourth contact hole CH4 within the thin film transistor region 101. The third passivation film 155 may be formed of an inorganic insulating material such as silicon nitride or silicon oxide.

In case of the modified embodiment of the first embodiment, the pixel electrode 140a and the first protection electrode 140b are formed by a separate process different from the process for forming the sensing line 600. However, the sensing line 600 may be formed together with the pixel electrode 140a and the first protection electrode 140b through a single process by using one mask to reduce the number of masks according to another embodiment of the present invention. In this case, because the sensing line 600 is directly formed on the pixel electrode 140a, the second passivation film 150 is formed on the sensing line 600, and the common electrode 160a is formed on the second passivation film 150, the third passivation film 155 may be omitted.

Second Embodiment

Figure 6:
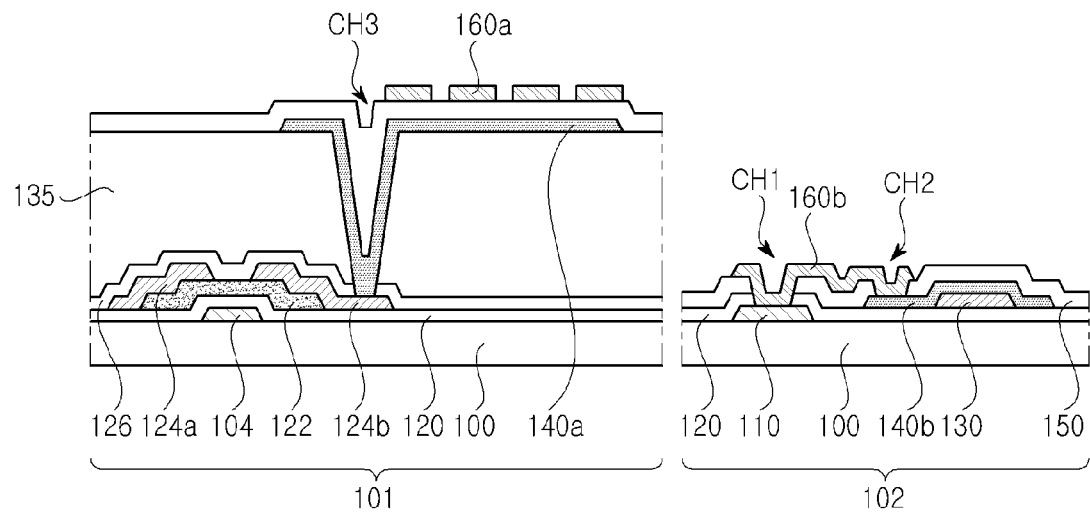
FIG. 6 is a cross-sectional view illustrating a display device to which a jumping structure according to the second embodiment of the present invention is applied.

FIG. 6 is a cross-sectional view illustrating a display device to which a jumping structure according to the second embodiment of the present invention is applied.

As illustrated in FIG. 6, in the display device that includes a jumping structure according to the second embodiment, a gate electrode 104 and a first metal 110 are deposited and patterned on a substrate 100. In one embodiment, the first metal 110 may be a gate pad formed of the same material as that of the gate electrode. Hereinafter, for convenience of description, it is assumed that the first metal 110 is a gate pad.

The gate electrode 104 is formed in a thin film transistor region 101, and the gate pad 110 is formed in a jumping region 102. The gate electrode 104 may be extended from a gate line (not shown), and the gate pad 104 is connected with one end of the gate line through a gate Gate In Panel (GIP, not shown). The gate in panel refers to a gate driving circuit that is integrated in the panel.

A gate insulating film 120 is formed on the gate electrode 104 and the gate pad 110. The gate insulating film 120 is formed on an entire surface of the substrate 100, and is etched to partially expose the gate pad 110 through a first contact hole CH1. This gate insulating film 120 may be formed by a plasma enhanced chemical vapor deposition (PECVD) method.

A semiconductor layer 122 and a second metal 130 are deposited and patterned on the gate insulating film 120. In one embodiment, the second metal 130 may be a data pad formed of the same material as that of a source electrode 124a and a drain electrode 124b, which will be described later. Hereinafter, for convenience of description, it is assumed that the second metal 130 is a data pad.

The semiconductor layer 122 is formed in the thin film transistor region 101, and may be formed of a silicon based semiconductor material or an oxide semiconductor material. The data pad 130 is formed in the jumping region 102, and is connected with one end of the data line (not shown).

The source electrode 124a and the drain electrode 124b are patterned on the semiconductor layer 122. The source electrode 124a and the drain electrode 124b are formed in the thin film transistor region 101. The source electrode 124a is connected with the data line, and the drain electrode 124b is spaced apart from the source electrode 124a while facing the source electrode 124a.

A first passivation film 126 is formed on the data line, the source electrode 124a, and the drain electrode 124b. The first passivation film 126 is formed in the thin film transistor region 101, and is etched to form a third contact hole CH3. The first passivation film 126 is also etched in the jumping region 102 where the gate pad 110 and the data pad 130 are formed. The first passivation film 126 may be formed of an inorganic insulating material such as silicon nitride or silicon oxide.

A planarization film 135 is formed on the first passivation film 126. The planarization film 135 is formed in the thin film transistor region but may not be formed on the gate pad 110 and the data pad 130. The planarization film 135 may be formed of an organic insulating material such as acrylic resin including a photo active compound (PAC). The planarization film 135 is formed at a thickness greater than that of the first passivation film 126 and may serve to planarize the surface of the substrate.

A pixel electrode 140a is deposited and patterned on the planarization film 135, and a first protection electrode 140b is patterned on the data pad 130. In other words, the first protection electrode 140b is formed on the data pad 130 in the jumping region 102 using the same material as that of the pixel electrode 140a when the pixel electrode 140a is formed.

The pixel electrode 140a is connected with the drain electrode 124b through the third contact hole CH3. The third contact hole CH3 is made by combination of holes respectively formed in the first passivation film 126 and the planarization film 135.

The first protection electrode 140b, which is formed of the same material as that of the pixel electrode 140a, is formed on the data pad 130 in the jumping region 102, thereby reducing or preventing the data pad 130 from being etched.

In more detail, the first protection electrode 140b is extended to the region where the data pad 130 is not formed to fully cover the data pad 130 on the gate insulating film 120.

A second passivation film 150 is formed on the pixel electrode 140a and the first protection electrode 140b. The second passivation film 150 is formed on an entire surface of the substrate, and is etched to expose or be part of the first and second contact holes CH1 and CH2. The second passivation film 150 may be formed of an inorganic insulating material such as silicon nitride or silicon oxide. At this time, in the second embodiment different from the first embodiment, the second passivation film 150 is formed such that the second contact hole CH2 is not overlapped with the data pad 130.

In other words, in case of the jumping structure according to the second embodiment of the present invention, because the second contact hole CH2 is formed by etching the second passivation film 150 which is not overlapped with the data pad 130, the first protection electrode 140b on the data pad 130 is not exposed externally during the process of forming the second contact hole CH2, whereby morphology deterioration caused by etching of the data pad 130 may be reduced or prevented. As a result, an opening or undercut of a connection electrode 160b, which will be described later, may be reduced or prevented.

The first protection electrode 140b is exposed through the second contact hole CH2.

A common electrode 160a and the connection electrode 160b are deposited and patterned on the second passivation film 150. The common electrode 160a is formed in the thin film transistor region 101, and the connection electrode 160b is formed in the jumping region 102.

In more detail, the connection electrode 160b is connected with the gate pad 110 through the first contact hole CH1, and is connected with the first protection electrode 140b through the second contact hole CH2. Because the connection electrode 160b is connected with the first protection electrode 140b through the second contact hole CH2 and the first protection electrode 140b is directly connected with the data pad 130 as described above, the connection electrode 160b is also connected with the data pad 130. Accordingly, the gate pad 110 is electrically connected with the data pad 130 through the connection electrode 160b.

The common electrode 160a and the connection electrode 160b may be formed of the same material by the same process.

In the second embodiment, the first protection electrode 140b is formed on the data pad 130 to reduce or prevent the data pad 130 from being etched.

Figure 7:
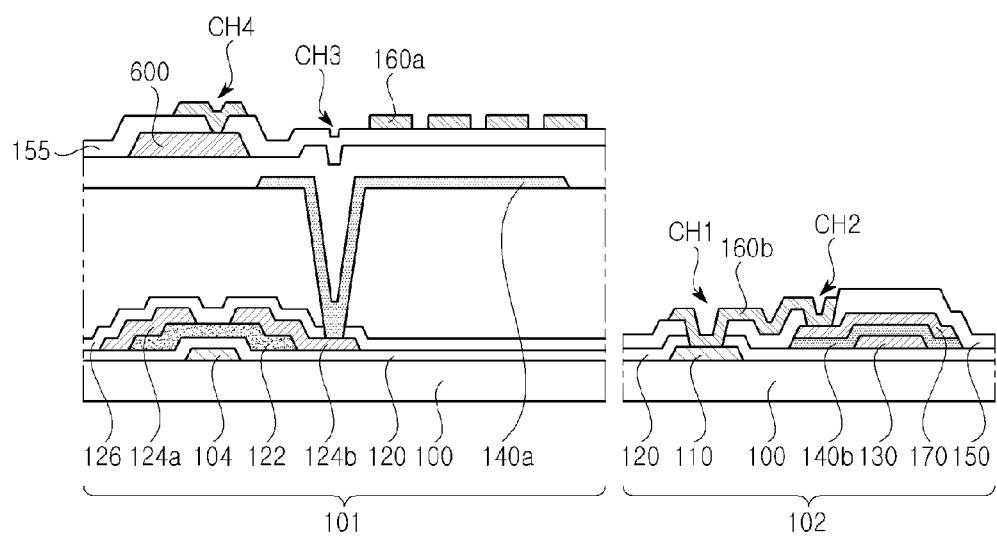
FIG. 7 is a cross-sectional view illustrating a display device to which a jumping structure according to the modified second embodiment of the present invention is applied.

When a display device according to the second embodiment of the present invention includes a sensing line for sensing a touch of a user, which is built in a display panel, as illustrated in FIG. 7, a second protection electrode 170 may additionally be formed of the same material as that of the sensing line on the first protection electrode 140b to reduce or prevent the data pad 130 from being etched. Because the other elements except for the second protection electrode 170 are the same as what is illustrated in FIG. 6 and the second protection electrode 170 is the same as what is illustrated in FIG. 5, their detailed description will be omitted.

Third Embodiment

Figure 8:
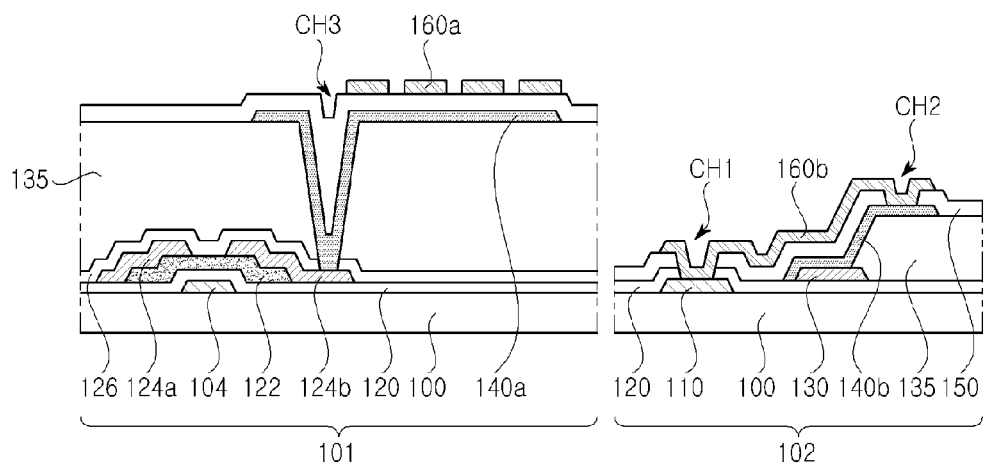
FIG. 8 is a cross-sectional view illustrating a display device to which a jumping structure according to the third embodiment of the present invention is applied.

FIG. 8 is a cross-sectional view illustrating a display device to which a jumping structure according to the third embodiment of the present invention is applied.

As illustrated in FIG. 8, in the display device that includes a jumping structure according to the third embodiment, a gate electrode 104 and a first metal 110 are deposited and patterned on a substrate 100. In one embodiment, the first metal 110 may be a gate pad formed of the same material as that of the gate electrode. Hereinafter, for convenience of description, it is assumed that the first metal 110 is a gate pad.

The gate electrode 104 is formed in a thin film transistor region 101, and the gate pad 110 is formed in a jumping region 102. The gate electrode 104 may be extended from a gate line (not shown), and the gate pad 104 is connected with one end of the gate line through a Gate In Panel (GIP, not shown). The gate in panel refers to a gate driving circuit that is integrated in the panel.

A gate insulating film 120 is formed on the gate electrode 104 and the gate pad 110. The gate insulating film 120 is formed on an entire surface of the substrate 100, and is etched to partially expose the gate pad 110 through a first contact hole CH1. This gate insulating film 120 may be formed by a plasma enhanced chemical vapor deposition (PECVD) method.

A semiconductor layer 122 and a second metal 130 are deposited and patterned on the gate insulating film 120. In one embodiment, the second metal 130 may be a data pad formed of the same material as that of a source electrode 124a and a drain electrode 124b, which will be described later. Hereinafter, for convenience of description, it is assumed that the second metal 130 is a data pad.

The semiconductor layer 122 is formed in the thin film transistor region 101, and may be formed of a silicon based semiconductor material or an oxide semiconductor material. The data pad 130 is formed in the jumping region 102, and is connected with one end of the data line (not shown).

The source electrode 124a and the drain electrode 124b are patterned on the semiconductor layer 122. The source electrode 124a and the drain electrode 124b are formed in the thin film transistor region 101. The source electrode 124a is connected with the data line, and the drain electrode 124b is spaced apart from the source electrode 124a while facing the source electrode 124a.

A first passivation film 126 is formed on the data line, the source electrode 124a, and the drain electrode 124b. The first passivation film 126 is formed in the thin film transistor region 101, and is etched to form a third contact hole CH3. The first passivation film 126 is also etched in the jumping region 102 where the gate pad 110 and the data pad 130 are formed. The first passivation film 126 may be formed of an inorganic insulating material such as silicon nitride or silicon oxide.

A planarization film 135 is formed on the first passivation film 126 inside the thin film transistor region 101 and on the data pad 130 inside the jumping region 102. In this case, the planarization film 135 is formed on the data pad 130 to partially expose the data pad 130. The planarization film 135 may be formed of an organic insulating material such as acrylic resin including a photo active compound (PAC). The planarization film 135 is formed at a thickness thicker than that of the first passivation film 126 and may serve to planarize the surface of the substrate.

A pixel electrode 140a is deposited and patterned on the planarization film 135, and a first protection electrode 140b is patterned on the data pad 130 and the planarization film 135. In other words, the pixel electrode 140a is patterned on the planarization film 135 within the thin film transistor region 101, and the first protection electrode 140b is formed on the data pad 130 and the planarization film 135 within the jumping region 102. At this time, the first protection electrode 140b is formed together with the pixel electrode 140a when the pixel electrode 140a is formed. In more detail, the first protection electrode 140b is extended to the region, which is not overlapped with the data pad 130, on the planarization film 135, while at least partially, e.g. fully, covering the data pad 130.

The pixel electrode 140a is connected with the drain electrode 124b through the third contact hole CH3. The third contact hole CH3 is made by combination of holes respectively formed in the first passivation film 126 and the planarization film 135.

A second passivation film 150 is formed on the pixel electrode 140a and the first protection electrode 140b. The second passivation film 150 is formed on an entire surface of the substrate, and is etched to expose or be part of the first and second contact holes CH1 and CH2. The second passivation film 150 may be formed of an inorganic insulating material such as silicon nitride or silicon oxide. At this time, the second contact hole CH2 is formed by etching the region for the second passivation film 150 formed on the planarization film 135, and may be formed so as not to overlap the data pad 130.

In other words, in case of the jumping structure according to the third embodiment of the present invention, because the second contact hole CH2 is formed by etching the region for the second passivation film 150 formed on planarization film 135, the region of the first protection electrode 140b, which is in contact with the data pad 130, is not exposed externally during the process of forming the second contact hole CH2. Accordingly, the morphology deterioration caused by etching of the data pad 130 may be reduced or prevented, whereby an opening or undercut of a connection electrode 160b, which will be described later, may be reduced or prevented.

The first protection electrode 140b is partially exposed on the planarization film 135 through the second contact hole CH2.

A common electrode 160a and the connection electrode 160b are deposited and patterned on the second passivation film 150. The common electrode 160a is formed in the thin film transistor region 101, and the connection electrode 160b is formed in the jumping region 102.

In more detail, the connection electrode 160b is connected with the gate pad 110 through the first contact hole CH1, and is connected with the first protection electrode 140b through the second contact hole CH2. Because the connection electrode 160b is connected with the first protection electrode 140b through the second contact hole CH2 and the first protection electrode 140b is directly connected with the data pad 130 as described above, the connection electrode 160b is also connected with the data pad 130. Accordingly, the gate pad 110 is electrically connected with the data pad 130 through the connection electrode 160b.

The common electrode 160a and the connection electrode 160b are formed of the same material by the same process.

In the third embodiment, the first protection electrode 140b is formed on the data pad 130 to reduce or prevent the data pad 130 from being etched.

Figure 9:
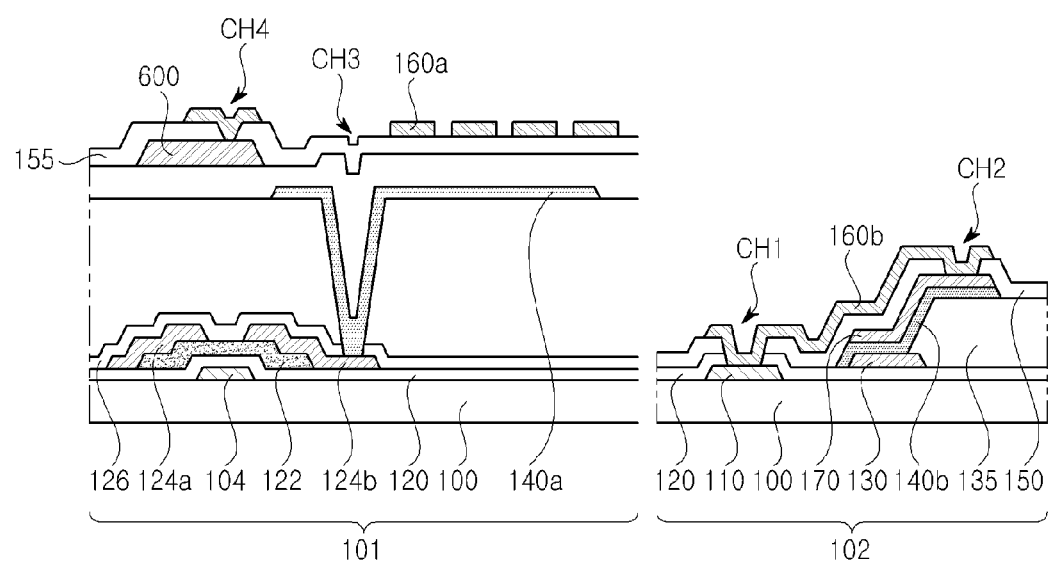
FIG. 9 is a cross-sectional view illustrating a display device to which a jumping structure according to the modified third embodiment of the present invention is applied.

When a display device according to the third embodiment of the present invention includes a sensing line for sensing a touch of a user, which is built in a display panel, as illustrated in FIG. 9, a second protection electrode 170 may additionally be formed of the same material as that of the sensing line on the first protection electrode 140b to prevent the data pad 130 from being etched. Because the other elements except for the second protection electrode 170 are the same as what is illustrated in FIG. 8 and the second protection electrode 170 is the same as what is illustrated in FIG. 5, their detailed description will be omitted.

The jumping structures according to the aforementioned embodiments may be used for various portions within a display device according to the present invention. For example, the jumping structures according to the aforementioned embodiments may be used for a pad portion included in a driving integrated circuit (not shown), or may be used in a Gate In Panel (GIP).

The substrate constituting the display device has been described as above, and a jumping structure of the present invention can be applied to various display devices, which may use the aforementioned substrate, for example, liquid crystal display devices, plasma display panels, and organic light emitting display devices.

Method for Fabricating a Display Device

Hereinafter, a method for fabricating a display device according to the present invention will be described with reference to FIGS. 10A to 10G.

FIGS. 10A to 10G are cross-sectional views illustrating a method for fabricating a display device according to the first embodiment of the present invention, and relate to process steps of fabricating the display device illustrated in FIG. 4.

Figure 10A:
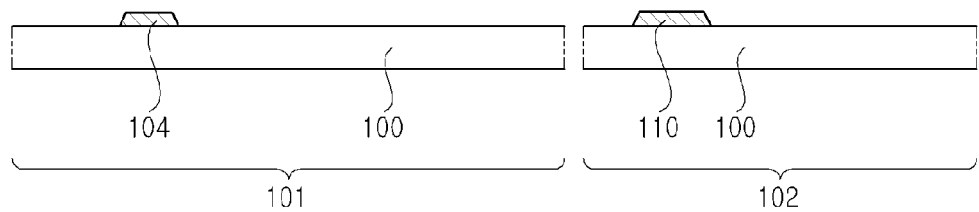
FIGS. 10A to 10G are cross-sectional views illustrating a method for fabricating a display device according to an embodiment of the present invention.

First of all, as illustrated in FIG. 10A, a thin film transistor region 101 to be provided with a thin film transistor and a jumping region 102 to be provided with a jumping structure are defined on a substrate 100. A gate electrode 104 and a first metal 110 are deposited and patterned on the substrate 100. In one embodiment, the first metal 110 may be a gate pad formed of the same material as that of the gate electrode 104. Hereinafter, for convenience of description, it is assumed that the first metal 110 is a gate pad.

The gate electrode 104 is formed in the thin film transistor region 101, and the gate pad 110 is formed in the jumping region 102.

The gate electrode 104 and the gate pad 110 may be patterned through a series of mask processes such as photoresist deposition, exposure, developing, etching and strip after depositing a thin film layer on the substrate 100 through, e.g., a sputtering method. A process of forming patterns of elements, which will be described hereinafter, may also be performed through the deposition of the thin film layer and the series of mask processes.

Figure 10B:
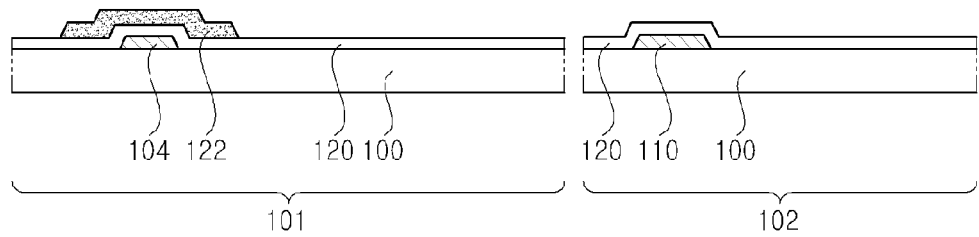

Next, as illustrated in FIG. 10B, a gate insulating film 120 is formed on the gate electrode 104 and the gate pad 110, and a semiconductor layer 122 is deposited and patterned on the gate insulating film 120. The gate insulating film 120 is formed on an entire surface of the substrate 100 by a plasma enhanced chemical vapor deposition (PECVD) method, and the semiconductor layer 122 is formed in the thin film transistor region 101.

Figure 10C:
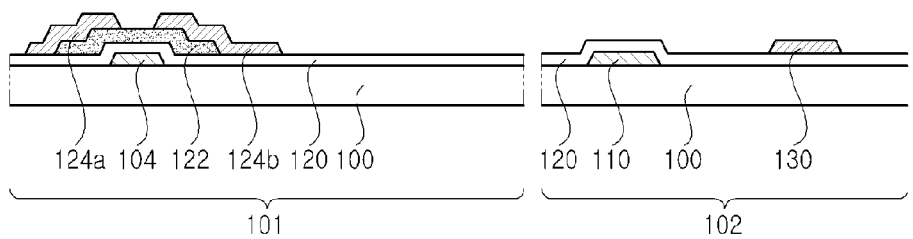

Next, as illustrated in FIG. 10C, a source electrode 124a and a drain electrode 124b, which are connected with a data line (not shown), are deposited and patterned on the semiconductor layer 122 and a second metal 130 is patterned on the gate insulating film 120. In one embodiment, the second metal 130 may be a data pad formed of the same material as that of the source electrode 124a and the drain electrode 124b. Hereinafter, for convenience of description, it is assumed that the second metal 130 is a data pad.

The source electrode 124a and the drain electrode 124b are formed in the thin film transistor region 101, and the data pad 130 is formed in the jumping region 102.

Figure 10D:
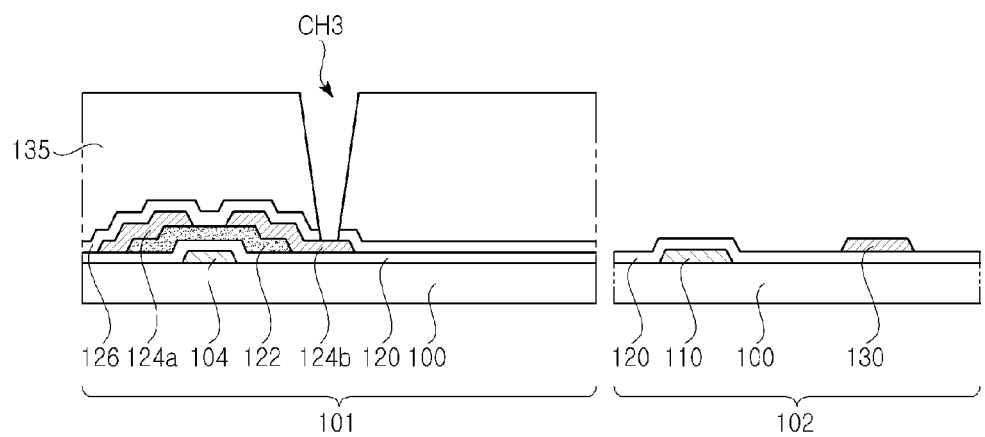

Next, as illustrated in FIG. 10D, a first passivation film 126 is formed on the data line, the data pad 130, the source electrode 124a, and the drain electrode 124b, and a planarization film 135 is deposited and patterned on the first passivation film 126. Afterwards, the first passivation film 126 and the planarization film 135 are partially removed to form a third contact hole CH3 for externally exposing the drain electrode 124b. When partially removing the first passivation film 126, the first passivation film 126 is also removed in the jumping region 102, as illustrated in FIG. 10D.

The first passivation film 126 is formed on the entire surface of the substrate by the PECVD method.

The planarization film 135 is formed in the thin film transistor region 101. In more detail, the planarization film 135 is patterned by exposure and developing processes after an organic insulating material including a photo active compound (PAC) is deposited on an entire surface of the substrate.

Figure 10E:
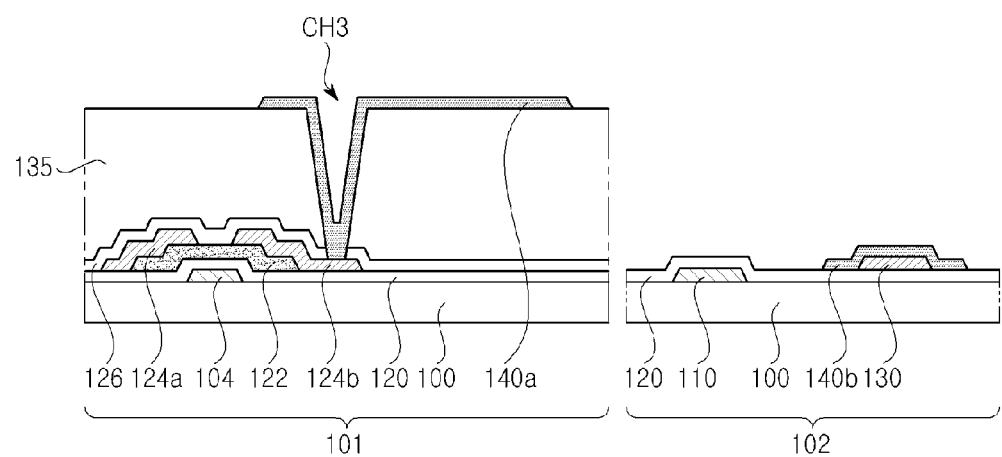

Next, a metal material layer (not shown) is formed on an entire surface of the substrate including the planarization film 135 and the data pad 130 and then patterned to form a pixel electrode 140a on the planarization film 135 and a first protection electrode 140b on the data pad 130, as illustrated in FIG. 10E. The pixel electrode 140a is patterned to be connected with the drain electrode 124b through the third contact hole CH3 in the thin film transistor region 101.

As described above, the first protection electrode 140b formed on the data pad 130 in the jumping region 102 may reduce or prevent the data pad 130 from being etched. In one embodiment, the metal material layer for forming the pixel electrode 140a and the first protection electrode 140b may be formed of a transparent conductive material such as Indium-Tin-Oxide (ITO).

Figure 10F:
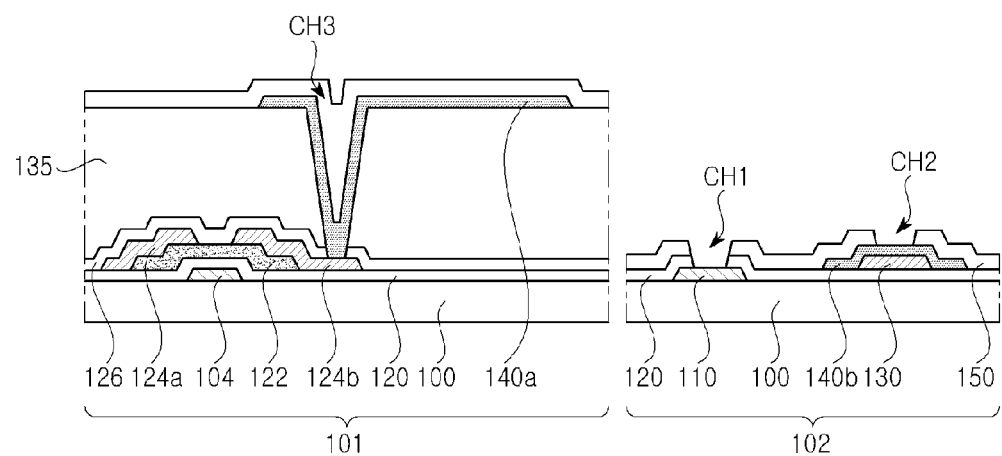

Next, as illustrated in FIG. 10F, after a second passivation film 150 is formed on an entire surface of the substrate including the pixel electrode 140a and the first protection electrode 140b, the second passivation film 150 formed in the jumping region 102 is partially removed to form a first contact hole CH1 for partially exposing the gate pad and a second contact hole CH2 for partially exposing the first protection electrode 140b formed on the data pad 130.

The second passivation film 150 is formed on an entire surface of the substrate by the PECVD method.

In the fabrication process according to the related art, two etching processes may negatively affect (e.g., damage) the morphology of the data pad 130, namely an etching process for forming the third contact hole CH3 (at this time, the first passivation film 126 may also be removed from above the data pad 130 thereby exposing the data pad 130 and affecting the surface morphology of the data pad 130) and an etching process for forming the second contact hole CH2 (at this time, the second passivation film 150 may also be removed from above the data pad 130 thereby again exposing the data pad 130 and affecting the surface morphology of the data pad 130).

In a jumping structure in accordance with various embodiments of the present invention, the data pad 130 may be protected by the first protection electrode 140b during the process of etching the second passivation film 150. Thus, the process of etching the second passivation film 150 may not negatively affect the surface morphology of the data pad 130. Thus, deterioration of the surface morphology of the data pad 130 may be prevented or at least substantially reduced.

Figure 10G:
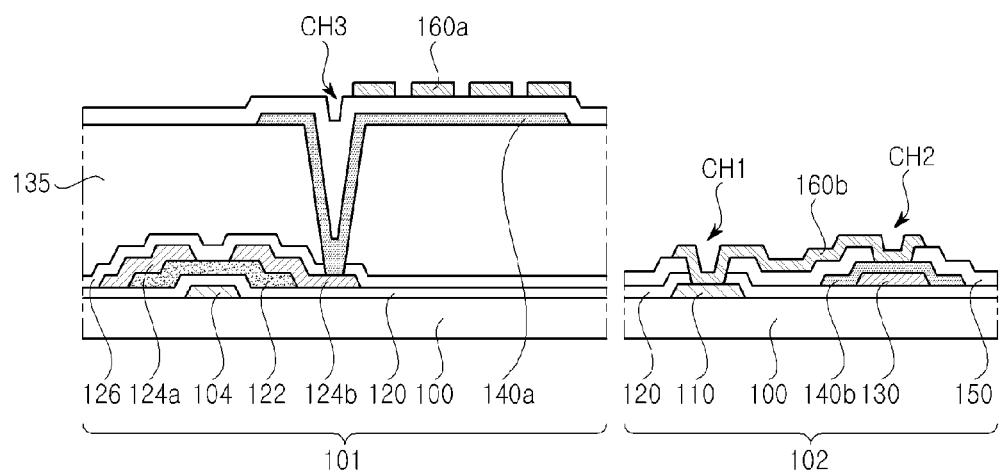

Next, as illustrated in FIG. 10G, a common electrode 160a and a connection electrode 160b are formed on the second passivation film 150. At this time, the connection electrode 160b is formed of the same material as that of the common electrode 160a.

The common electrode 160a may be patterned in the thin film transistor region 101 to have a plurality of slits (not shown) therein.

The connection electrode 160b is connected with the gate pad 110 through the first contact hole CH1, and is connected with the first protection electrode 140b through the second contact hole CH2. Because the connection electrode 160b is connected with the first protection electrode 140b through the second contact hole CH2 and the first protection electrode 140b is directly connected with the data pad 130, the connection electrode 160b is also connected with the data pad 130. Accordingly, the gate pad 110 is electrically connected with the data pad 130 through the connection electrode 160b.

In the aforementioned embodiment, the first protection electrode 140b is formed on the data pad 130 to prevent the data pad 130 from being etched.

When a display device according to the present invention includes a sensing line 600 for sensing a touch of a user, which is built in a display panel, as illustrated in FIG. 5, a second protection electrode 170 may additionally be formed of the same material as that of the sensing line 600 on the first protection electrode 140b to reduce or prevent the data pad 130 from being etched. At this time, the second protection electrode 170 may be formed together with the sensing line 600 when the sensing line 600 is formed. The first protection electrode 170 and the sensing line 600 may be formed by forming a material layer for forming the sensing line 600 on an entire surface of the substrate 100 and then patterning the corresponding material layer.

Also, to reduce the number of masks when the sensing line 600 and the second protection electrode 170 are formed, the sensing line 600 and the second protection electrode 170 may be formed together with the pixel electrode 140a and the first protection electrode 140b. In this case, the sensing line 600 is directly formed on the pixel electrode 140a, the second passivation film 150 is formed on the sensing line 600, and the common electrode 160a is formed on the second passivation film 150.

Also, in the aforementioned embodiment, the second contact hole CH2 is formed in the region which is overlapped with the data pad 130. However, in the modified embodiment, as illustrated in FIGS. 6 and 7, the second contact hole CH2 may be formed in the region which is not overlapped with the data pad 130. To this end, the first protection electrode 140*b* is extended to the region where the data pad 130 is not formed, in the jumping region 102, while at least partially, e.g. fully, covering the data pad 130 on the gate insulating film 120.

Also, in the aforementioned embodiment, the planarization film 135 is not formed in the jumping region 102. However, in the modified embodiment, as illustrated in FIGS. 8 and 9, the planarization film 135 may be formed on the data pad 130 to partially expose the data pad 130 within the jumping region 102. According to this embodiment, the first protection electrode 140*b* is patterned on the planarization film 135 within the jumping region 102, and the second passivation film 150 is formed on the first protection electrode 140*b*. At this time, the second contact hole CH2 is formed by etching the region for the second passivation film 150 formed on the planarization film 135, and may be formed so as not to overlap the data pad 130.

According to this embodiment, because the region for the second passivation film 150 formed on the planarization film 135 is etched to form the second contact hole CH2, the region of the first protection electrode 140*b*, which is in contact with the data pad 130, is not exposed externally during the process of forming the second contact hole CH2. Accordingly, morphology deterioration caused by etching of the data pad 130 may be reduced or prevented, whereby an opening or undercut of the connection electrode 160*b* may be reduced or prevented.

According to the present invention as described above, the following advantages may be obtained.

Because the second metal is not as much exposed to an etching condition as compared with the related art when the jumping structure for electrical connection between the first metal and the second metal is formed, morphology deterioration of the second metal may be reduced or prevented, whereby an opening or undercut of the connection electrode for connecting the first metal with the second metal may be reduced or prevented.

For example, in the fabrication process according to the related art, two etching processes may negatively affect (e.g., damage) the morphology of the second metal, namely an etching process for forming a contact hole for contacting a drain electrode (at this time, a first passivation film may also be removed from above the second metal thereby exposing the second metal and affecting the surface morphology of the second metal) and an etching process for forming a contact hole for contacting the second metal (at this time, a second passivation film may also be removed from above the second metal thereby again exposing the second metal and affecting the surface morphology of the second metal).

In a jumping structure in accordance with various embodiments of the present invention, the second metal may be protected by a protection electrode during the process of etching the second passivation film. Thus, the process of etching the second passivation film may not negatively affect the surface morphology of the second metal. Thus, deterioration of the surface morphology of the second metal may be prevented or at least substantially reduced.

Also, according to the present invention, because an opening of the connection electrode may be reduced or prevented, a defect of the gate line or the data line may also be reduced or prevented, thereby improving reliability of the display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
    a gate electrode and a first metal pattern on a substrate, the gate electrode being on a first region of the substrate and the first metal pattern being on a second region of the substrate;
    an insulating film on the gate electrode and the first metal pattern and provided with a first hole for exposing at least a part of the first metal pattern;
    source and drain electrodes on the insulating film in the first region and a second metal pattern on the insulating film in the second region;
    a first passivation film on the source and drain electrodes in the first region and having a fourth hole, the first passivation film not being on the second metal pattern in the second region;
    a planarization film on the first passivation film, wherein the planarization film has a fifth hole in the first region and is not disposed on the second metal pattern in the second region;
    a pixel electrode on the planarization film in the first region, the pixel electrode electrically connected with the drain electrode through a third contact hole formed by a combination of the fourth hole and the fifth hole;
    a first protection electrode on the second metal pattern, the first protection electrode electrically connected with the second metal pattern and at least partially covering the second metal pattern;
    a second passivation film which is separate and distinct from the first passivation film not being in the second region, on an entire surface of the substrate including the pixel electrode, the planarization film, and the first protection electrode, and provided with a second hole for exposing at least a part of the first metal pattern and a third hole for exposing at least a part of the first protection electrode, the second passivation film being a continuous layer; and
    a connection electrode on the second passivation film, the connection electrode connected with the first metal pattern through a first contact hole formed by a combination of the first hole and the second hole, and connected with the first protection electrode through a second contact hole formed of the third hole,
    wherein the first protection electrode and the pixel electrode are formed of the same material, and
    wherein the first metal pattern is electrically connected to the second metal pattern through the connection electrode.

2. The display device of claim 1, wherein the first protection electrode is extended to a region where the second metal pattern is not on the insulating film, and the third hole is in the second passivation film to expose the extended region of the first protection electrode, which is not overlapped with the second metal pattern.

3. The display device of claim 1, wherein the first protection electrode is on the planarization film and the second metal pattern which is not provided with the planarization film in the second region to at least partially cover the second metal pattern, and
    wherein the first metal pattern is the same material as the gate electrode and the second metal pattern is the same material as the source and drain electrodes.

4. The display device of claim 3, wherein the planarization film is acrylic resin including photo active compound (PAC).

5. The display device of claim 1, wherein the first metal pattern is configured as a gate pad and the second metal pattern is configured as a data pad.

6. The display device of claim 3, wherein the third hole is in a region of the second passivation film that is laterally offset from the second metal pattern.

7. The display device of claim 1, further comprising a common electrode for receiving a touch signal of a user and a sensing line connected with the common electrode, wherein the connection electrode is the same material as that of the common electrode.

8. The display device of claim 1, wherein the first metal pattern is the same material as the gate electrode and the second metal pattern is the same material as the source and drain electrodes.

9. The display device of claim 1, wherein the connection electrode is directly in contact with the second passivation film.

10. A method for fabricating a display device, the method comprising:
forming a gate insulating film, which has a hole for exposing at least a part of a first metal pattern, on a gate electrode formed on a first region of a substrate and the first metal pattern formed on a second region of the substrate;
forming source and drain electrodes on the gate insulating film of the first region, and forming a second metal pattern on the insulating film of the second region;
forming a first passivation film on the source and drain electrodes in the first region and having a fourth hole;
forming a planarization film on the first passivation film such that that the planarization film has a fifth hole in the first region and that the second metal pattern is exposed in the second region;
forming a first material layer for forming a pixel electrode, on an entire surface of the substrate including the source electrode, the drain electrode, the second metal pattern, the first passivation film, and the planarization film;
forming the pixel electrode electrically connected with the drain electrode on the first region through a third contact hole formed by a combination of the fourth hole and the fifth hole by patterning the first material layer and forming a first protection electrode, which is electrically connected with the second metal pattern and covers the second metal pattern, on the second metal pattern in the second region;
forming a second passivation film which is separate and distinct from the first passivation film not being in the second region, on an entire surface of the substrate including the pixel electrode, the planarization film, and the first protection electrode, the second passivation film being provided with a second hole for exposing at least a part of the first metal pattern and a third hole for exposing at least a part of the first protection electrode, wherein the second passivation film being a continuous layer; and
forming a common electrode on the second passivation film in the first region and forming a connection electrode on the second passivation film in the second region, the connection electrode being connected with the first metal pattern through a first contact hole formed by a combination of the first hole and the second hole and being connected with the first protection electrode through a second contact hole formed of the third hole,
wherein the first metal pattern is electrically connected to the second metal pattern through the connection electrode.

11. The method of claim 10, wherein the first protection electrode is extended to a region where the second metal pattern is not formed on the insulating film, and the third hole is formed in the second passivation film to expose the extended region of the first protection electrode, which is not overlapped with the second metal pattern.

12. The method of claim 10, wherein the planarization film is formed on an entire surface of the substrate including the source and drain electrodes in the first region and on the second metal pattern to partially expose the second metal pattern in the second region, and wherein the first protection electrode is formed on the planarization film and the second metal pattern where the planarization film is not formed to cover the second metal pattern in the second region.

13. The method of claim 12, wherein the planarization film is formed of acrylic resin including photo active compound (PAC).

14. The method of claim 10, further comprising the steps of forming a second material layer on an entire surface of the substrate including the first protection electrode and the pixel electrode and forming a sensing line connected with the common electrode to receive a touch signal of a user on the pixel electrode in the first region and forming a second protection electrode on the first protection electrode in the second region by patterning the second material layer between the step of forming the pixel electrode and the step of forming the second passivation film, wherein the connection electrode is connected with the first protection electrode through the second protection electrode.

15. The method of claim 10, wherein the connection electrode and the common electrode are formed using the same material as each other at the same time.

16. The method of claim 10, wherein the common electrode is formed to be directly in contact with the second passivation film.

17. A display device comprising:
a gate electrode and a first metal pattern on a substrate, the gate electrode being on a first region of the substrate and the first metal pattern being on a second region of the substrate;
an insulating film on the gate electrode and the first metal pattern and provided with a first hole for exposing at least a part of the first metal pattern;
source and drain electrodes on the insulating film in the first region and a second metal pattern on the insulating film in the second region;
a first passivation film on the source and drain electrodes in the first region and having a fourth hole, the first passivation film not being on the second metal pattern in the second region;
a planarization film on the first passivation film, wherein the planarization film has a fifth hole in the first region and is not disposed on the second metal pattern in the second region;
a pixel electrode on the planarization film in the first region, the pixel electrode electrically connected with the drain electrode through a third contact hole formed by a combination of the fourth hole and the fifth hole, a first protection electrode on the second metal pattern, and a second protection electrode on the first protection electrode, the first protection electrode electrically connected with the second metal pattern and at least partially covering the second metal pattern;

a second passivation film which is separate and distinct from the first passivation film not being in the second region, on an entire surface of the substrate including the pixel electrode, the planarization film, and the second protection electrode and provided with a second hole for exposing at least a part of the first metal pattern and a third hole for exposing at least a part of the second protection electrode, wherein the second passivation film is a continuous layer; and a connection electrode on the second passivation film, the connection electrode connected with the first metal pattern through a first contact hole formed by a combination of the first hole and the second hole, and connected with the second protection electrode through a second contact hole formed of the third hole, wherein the first protection electrode is the same material as the pixel electrode, wherein the connection electrode is connected with the first protection electrode through the second protection electrode, and wherein the first metal pattern is electrically connected to the second metal pattern through the connection electrode.

18. The display device of claim 17, further comprising a common electrode for receiving a touch signal of a user and a sensing line connected with the common electrode, wherein the second protection electrode is the same material as the sensing line, and the connection electrode is the same material as the common electrode.

19. The display device of claim 17, wherein the first protection electrode and the second protection electrode are extended to a region where the second metal pattern is not on the insulating film, and the third hole is in the second passivation film to expose the extended region of the second protection electrode, which is not overlapped with the second metal pattern.

20. The display device of claim 17, wherein the first protection electrode and the second protection electrode are on the planarization film and the second metal pattern which is not provided with the planarization film in the second region to at least partially cover the second metal pattern, and wherein the first metal pattern is the same material as the gate electrode and the second metal pattern is the same material as the source and drain electrodes.

21. The display device of claim 20, wherein the third hole is in a region of the second passivation film that is laterally offset from the second metal pattern.

22. The display device of claim 17, wherein the connection electrode is directly in contact with the second passivation film.

* * * * *